(12) United States Patent
Ray et al.

(10) Patent No.: US 11,369,021 B2
(45) Date of Patent: *Jun. 21, 2022

(54) CUSTOMIZABLE ANIMATED LED DISPLAY FOR PRODUCT PACKAGE INSERT

(71) Applicant: Nthdegree Technologies Worldwide Inc., Tempe, AZ (US)

(72) Inventors: Alexander Ray, Tempe, AZ (US); Richard Blanchard, Los Altos, CA (US); Shawn Barber, Bay City, MI (US); David Moffenbeier, Lake Oswego, OR (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/203,301

(22) Filed: Mar. 16, 2021

(65) Prior Publication Data

US 2021/0204405 A1 Jul. 1, 2021

Related U.S. Application Data

(63) Continuation of application No. 15/009,727, filed on Jan. 28, 2016, now Pat. No. 10,980,121, which is a
(Continued)

(51) Int. Cl.
*H05K 1/16* (2006.01)
*B65D 5/42* (2006.01)
*H05B 45/12* (2020.01)

(52) U.S. Cl.
CPC ............ *H05K 1/16* (2013.01); *B65D 5/4212* (2013.01); *B65D 5/4216* (2013.01);
(Continued)

(58) Field of Classification Search
CPC .......... H05K 1/16; H05K 2201/10037; H05K 2201/10106; B65D 5/4212; B65D 2203/12; H05B 45/12
See application file for complete search history.

(56) References Cited

U.S. PATENT DOCUMENTS 5,572,817 A 11/1996 Chien
8,207,691 B2 6/2012 Slot et al.
(Continued)

FOREIGN PATENT DOCUMENTS

FR 2954812 A1 10/2014
WO 2014152611 A1 9/2014

OTHER PUBLICATIONS

PCT/US2016/042333, EPO as ISA, International Search Report and Written Opinion, 12 pages.

*Primary Examiner* — Wei (Victor) Y Chan
(74) *Attorney, Agent, or Firm* — Patent Law Group; Brian Ogonowsky

(57) ABSTRACT

On a flexible substrate is printed LEDs and a driver circuit containing transistors. The LEDs and transistors are printed microscopic devices contained in an ink. The LEDs are printed in groups and connected in parallel, and the transistors are printed in groups and connected in parallel. Other components, such as resistors and an on/off switch, are also printed to form the driver. A battery and other circuit components may also be printed on the substrate. An overlay is provided over the LEDs to create a desired light pattern. The LEDs and driver may be generic, and the overlay customizes the light pattern for a particular application. The transistors in the driver may be interconnected with a trace pattern to drive the LEDs in a customized manner, such as for an insert in a product package for marketing to a consumer.

19 Claims, 5 Drawing Sheets

Related U.S. Application Data continuation-in-part of application No. 14/801,374, filed on Jul. 16, 2015, now abandoned.

(60) Provisional application No. 62/116,843, filed on Feb. 16, 2015.

(52) U.S. Cl.
CPC .......... *B65D 2203/12* (2013.01); *H05B 45/12* (2020.01); *H05K 2201/10037* (2013.01); *H05K 2201/10106* (2013.01)

(56) References Cited

U.S. PATENT DOCUMENTS

| | | |
|---|---|---|
| 2003/0058191 A1 | 3/2003 | Yuhara et al. |
| 2006/0244707 A1 | 11/2006 | Furihata et al. |
| 2009/0085500 A1 | 4/2009 | Zampini et al. |
| 2010/0219745 A1 | 9/2010 | Tanimoto et al. |
| 2012/0164796 A1 | 6/2012 | Lowenthal et al. |
| 2012/0262076 A1 | 10/2012 | Briggs |
| 2012/0318985 A1 | 12/2012 | Bushee |
| 2013/0069560 A1 | 3/2013 | Kurita |
| 2014/0225515 A1 | 8/2014 | Lowenthal et al. |
| 2014/0264460 A1 | 9/2014 | Blanchard |
| 2014/0268591 A1* | 9/2014 | Ray ........................ H05K 1/029 361/748 |
| 2014/0302373 A1 | 10/2014 | Lockett et al. |
| 2014/0317916 A1 | 10/2014 | Clifford |
| 2015/0108906 A1 | 4/2015 | Tischler et al. |
| 2015/0108907 A1 | 4/2015 | Tischler et al. |
| 2015/0233560 A1 | 8/2015 | Cheng et al. |
| 2015/0360606 A1 | 12/2015 | Thompson et al. |
| 2015/0371570 A1 | 12/2015 | Sciackitano et al. |
| 2016/0035924 A1 | 2/2016 | Oraw et al. |
| 2016/0163256 A1 | 6/2016 | Hochman et al. |
| 2016/0218257 A1 | 7/2016 | Ray et al. |

\* cited by examiner

CUSTOMIZABLE ANIMATED LED DISPLAY FOR PRODUCT PACKAGE INSERT

CROSS-REFERENCE TO RELATED APPLICATIONS

This application is a continuation of U.S. application Ser. No. 15/009,727, filed Jan. 28, 2016, which is a continuation-in-part of U.S. application Ser. No. 14/801,374, filed Jul. 16, 2015, and is also based on U.S. provisional application Ser. No. 62/116,843, filed Feb. 16, 2015, all assigned to the present assignee and incorporated herein by reference.

FIELD OF THE INVENTION

This invention relates to printing devices, such as light emitting diodes (LEDs), transistors, batteries, capacitors, inductors, resistors, and any other components, to form a driver for the LEDs on a flexible substrate. The LEDs and transistors may be microscopic devices printed as an ink in separate groups on the substrate, where the randomly distributed devices in each group are connected in parallel.

BACKGROUND

It is known, by the present assignee's own work, how to form and print microscopic 2-terminal vertical light emitting diodes (LEDs), with the proper orientation, on a conductive substrate and connect the LEDs in parallel to form a light sheet. Details of such printing of LEDs can be found in U.S. Pat. No. 8,852,467, entitled, Method of Manufacturing a Printable Composition of Liquid or Gel Suspension of Diodes, assigned to the present assignee and incorporated herein by reference.

Such a light sheet is driven by a conventional external power supply, and any other external circuitry, connected to anode and cathode terminals of the light sheet. Such conventional driver circuitry adds cost and considerable size and weight to the overall lighting system.

What is needed is a smaller and more inexpensive LED driver for LEDs.

SUMMARY

Disclosed herein is a flexible substrate having printed on it LEDs and driver circuitry for the LEDs. The driver circuit comprises at least switching transistors that supply a desired current through one or more LEDs printed on the substrate. A battery may also be printed on the substrate so no external circuitry is required for the illumination structure. The inexpensive structure is particularly advantageous where the structure only has a temporary use and is then disposed of, such as a product package insert for attracting customers.

In one embodiment, the LEDs are printed in a standardized area on the substrate, such as in an elongated rectangular area, and the printed driver circuit is connected to the LED area via metal traces printed on the substrate. A laminated layer (an overlay) may include an opaque sheet with cut-out areas for allowing the LED light to pass through in any pattern, such as an image or alpha-numeric characters. The overlay may also include translucent portions having a phosphor pattern for creating any color light pattern. The overlay may also include printed graphics.

The circuitry printed on the substrate may be especially designed for a particular LED display, or the circuit components may be standardized and later interconnected by a trace pattern for driving the LEDs in a customized manner. An array of separately driven LED groups may be printed to create animated displays and/or to better distribute power among traces.

A very inexpensive driver/battery/photo-switch/LED assembly can be printed on a single flexible substrate as a disposable and temporary illumination structure, such as for packaging and marketing purposes.

Other embodiments are disclosed.

DETAILED DESCRIPTION

Figure 1:
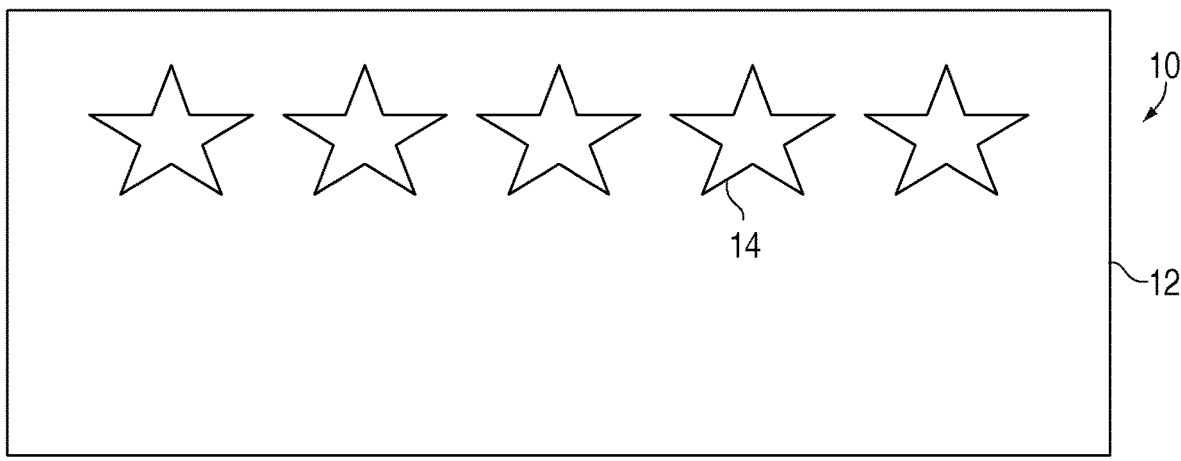
FIG. 1 illustrates an overlay for the substrate/circuit of FIG. 2 to create a customized light emission pattern.
Figure 2:
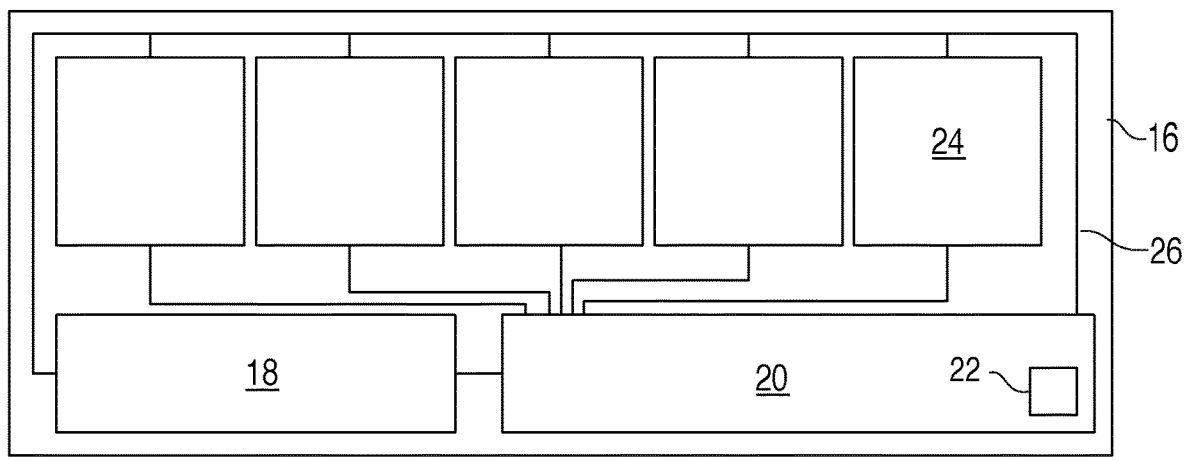
FIG. 2 illustrates a flexible substrate having a printed battery, printed driver, and printed LEDs, which may be standardized, where the display is then customized by the overlay of FIG. 1.

FIG. 1 illustrates a simple overlay 10 for customizing the illumination structure of FIG. 2. In one embodiment, the overlay 10 is an opaque sheet 12 with cut-outs 14 in any shape that allow light to pass through. Star shapes are shown. In another embodiment, the shapes may be defined by a transparent or translucent film. A phosphor for wavelength-converting LED light may be formed over the film, or the phosphor can be directly formed over the LED areas of FIG. 2. In another embodiment, the overlay 10 may use a transparent film, and opaque graphics are printed over the film to create the desired light emission pattern, including alpha-numeric characters or any other image. The illumination structure can be any size, such as a postcard size or much larger.

FIG. 2 illustrates a thin flexible substrate 16, such as PET, PMMA, Mylar, paper, etc. On the substrate 16 is provided conductive layers, such as by printing or lamination. The conductive layers may be a metal film or a transparent conductor (e.g., ITO). The conductive layers are described later when describing the printing of various circuit components. Over the conductive layers or over dielectric portions of the substrate 16 are printed a battery 18, an LED driver 20, a photo-switch 22, LED areas 24, and metal traces 26 that interconnect the battery 18, driver 20, photo-switch 22, and LED areas 24. The metal traces 26 may be printed or formed by laser etching a metal layer, or formed in any other way.

Each LED area 24 comprises a random distribution of printed, inorganic microscopic LED dies. The LED dies are printed using an LED ink that is later cured. The LED dies in each of the five areas 24 are connected in parallel by being sandwiched between two conductive layers, described in detail layer. Metal traces 26 connect each LED area 24 to the driver 20. The driver 20 may be configured to drive each LED area 24 independently to create an animation, or the driver 20 may drive all the LED areas 24 together. The LED areas 24 may be divided to limit the currents through the traces 26 and driver transistors.

Figure 3:
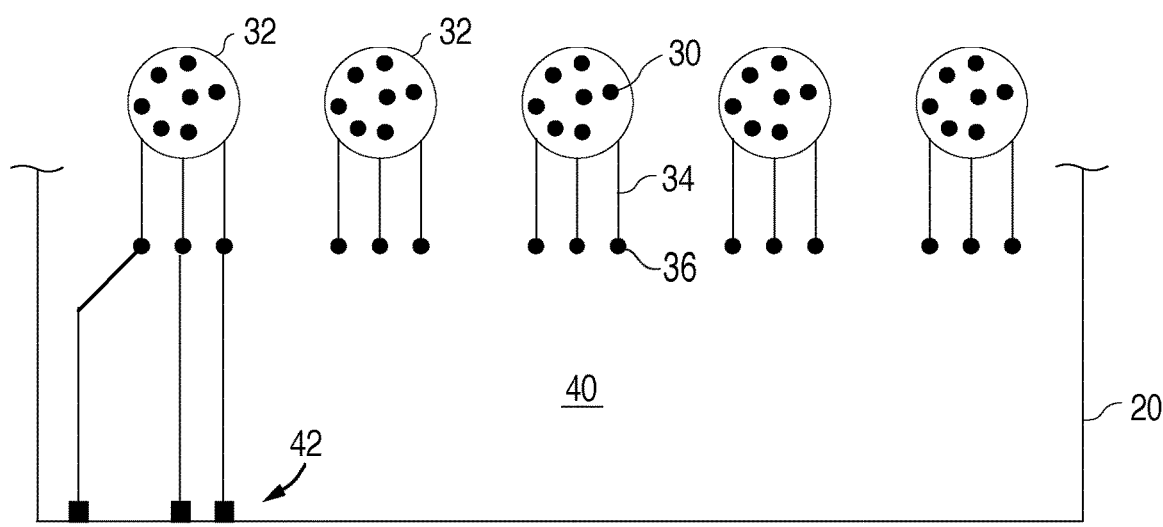
FIG. 3 illustrates how microscopic devices can be printed in a small group (e.g., a dot) and connected in parallel to form a single component, where multiple groups can be interconnected to form a variety of circuits, including a driver for LEDs.

FIG. 3 is a close-up view of a small segment of the driver 20 where individual microscopic transistors 30 are printed in groups 32, using a transistor ink, and all the transistors 30 in a single group are connected in parallel using three conductor layers, one conductor layer per terminal of the transistors. Each group 32 thus acts as a single transistor with three metal traces 34 terminating in interconnection pads 36. Any number of the transistors can be interconnected or connected to the printed battery 18, LED groups 24, etc. Some or all of the interconnection pads 36 (especially the driver I/O pads) may be located in a patch area 40 near the edge of the driver 20 to simplify the interconnections. A metal pattern performs all the interconnections. In the example, the leftmost transistor has its leads connected to I/O terminals 42 at the edge of the driver block to receive a control signal (such as from the photo-switch 22 in FIG. 2) and to conduct an LED current between its other two terminals. The transistors may also be interconnected to form any type of logic gate. Resistors may also be printed and interconnected within the driver 20. Each transistor group 32 may only be 1-2 mm in diameter and contain one or more individual transistor dies. The groups 32 may be formed in an ordered array along with other components.

Laying out the available components in a standardized array enables customization of the driver 20 by only selecting a metal trace pattern.

Alternatively, a complete driver circuit may be optimally laid out in the printing process, rather than printing an ordered array of groups of components that may or may not be used, using screen printing, flexography, inkjet, etc. Such a pre-designed driver will take up much less area then using the standardized layout of FIG. 3.

Figure 4:
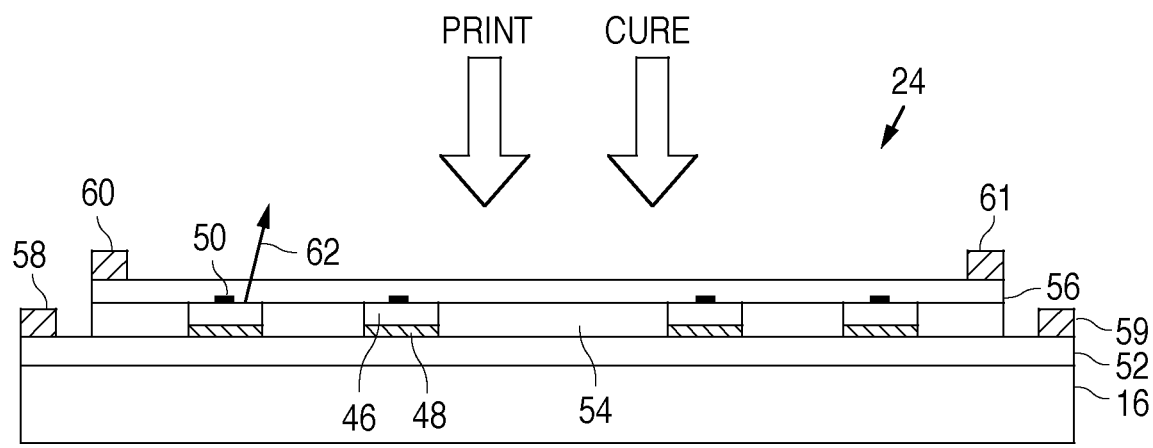
FIG. 4 is a cross-sectional view of a group of printed LEDs, connected in parallel, on the substrate of FIG. 2.
Figure 5:
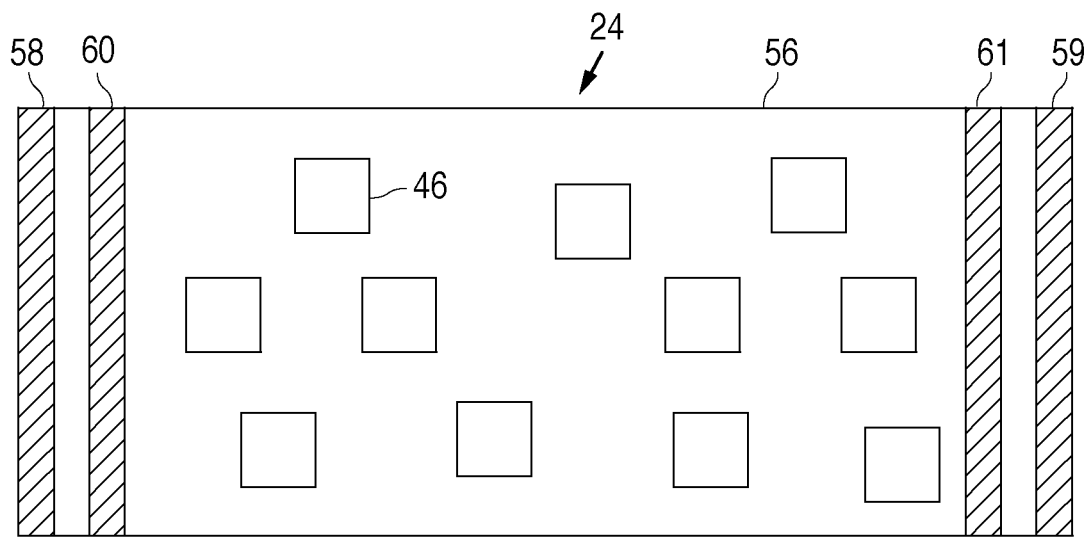
FIG. 5 is a top down view of the group of printed LEDs in FIG. 4.

FIGS. 4 and 5 illustrate the printing of the LED areas 24 on the substrate 16 of FIG. 2.

FIG. 4 is a cross-sectional view of a layer of LEDs 46 in a group 24 that may be printed using the following process. Each LED 46 includes standard semiconductor GaN layers, including an n-layer, and active layer, and a p-layer.

An LED wafer, containing many thousands of vertical LEDs, is fabricated so that the bottom metal cathode electrode 48 for each LED 46 includes a reflective layer. The top metal anode electrode 50 for each LED 46 is small to allow almost all the LED light to escape the anode side. A carrier wafer, bonded to the "top" surface of the LED wafer by an adhesive layer, may be used to gain access to both sides of the LED for metallization. The LEDs 46 are then singulated, such as by etching trenches around each LED down to the adhesive layer and dissolving the exposed adhesive layer or by thinning the carrier wafer.

The microscopic LEDs are then uniformly infused in a solvent, including a viscosity-modifying polymer resin, to form an LED ink for printing, such as screen printing or flexographic printing.

If it is desired for the anode electrodes 50 to be oriented in a direction opposite to the substrate 16 after printing, the electrodes 50 are made tall so that the LEDs 46 are rotated in the solvent, by fluid pressure, as they settle on the substrate surface. The LEDs 46 rotate to an orientation of least resistance. Over 90% like orientation has been achieved. Alternatively, the LEDs 46 may be printed with a random orientation and driven with an AC signal.

If the substrate 16 itself is not conductive, a reflective conductor layer 52 (e.g., aluminum) is deposited on the substrate 16 such as by printing.

The LEDs 46 are then printed on the conductor layer 52 such as by flexography, where a pattern on a rolling plate determines the deposition for a roll-to-roll process, or by screen printing with a suitable mesh to allow the LEDs to pass through and control the thickness of the layer, or by other printing techniques. Because of the comparatively low concentration, the LEDs 46 will be printed as a monolayer and be fairly uniformly distributed over the conductor layer 52.

The solvent is then evaporated by heat using, for example, an infrared oven. After curing, the LEDs 46 remain attached to the underlying conductor layer 52 with a small amount of residual resin that was dissolved in the LED ink as a viscosity modifier. The adhesive properties of the resin and the decrease in volume of resin underneath the LEDs 46 during curing press the bottom LED electrode 48 against the underlying conductor 52, making ohmic contact with it.

A dielectric layer 54 is then printed over the surface to encapsulate the LEDs 46 and further secure them in position.

A top transparent conductor layer 56 is then printed over the dielectric layer 54 to electrically contact the electrodes 50 and is cured in an oven appropriate for the type of transparent conductor being used.

If needed to spread current, metal bus bars 58-61 are then printed along opposite edges of the conductor layers 52 and 56 and electrically terminate at anode and cathode leads (not shown), respectively, for energizing the LEDs 46 in the group 24. The bus bars 58-61 will ultimately be connected to a positive, negative, or AC driving voltage.

FIG. 5 is a top down view of FIG. 4, where the cross-section of FIG. 4 is a horizontal bisection of FIG. 5. The locations of the LEDs 46 in the printed layer are random.

If a suitable voltage differential is applied to the anode and cathode leads, all the LEDs 46 with the proper orientation will be illuminated. FIG. 4 shows a light ray 62.

The LED groups 24 may also be printed as small dots forming addressable pixels of a display, which are powered by the printed driver 20 of FIG. 2.

FIGS. 6-10 describe printing 3-terminal microscopic transistors in the driver 20 of FIGS. 2 and 3.

Figure 6:
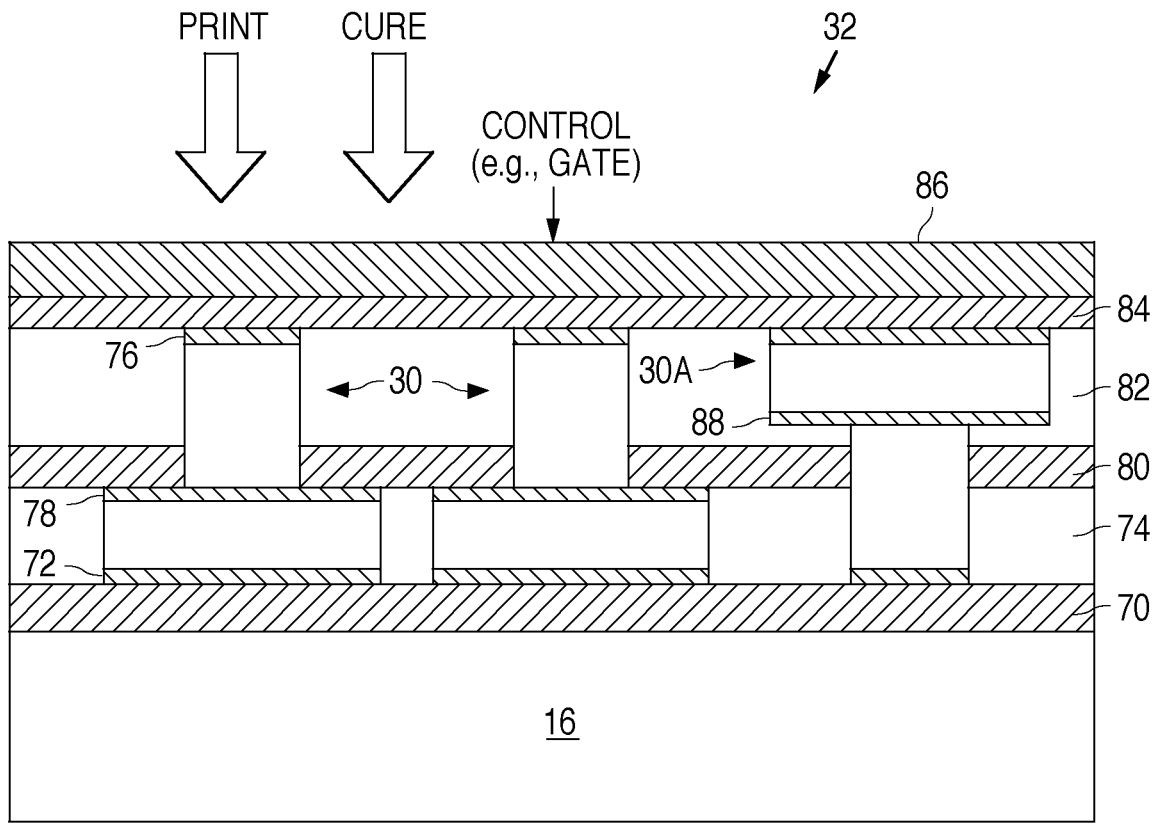
FIG. 6 is a cross-sectional view of transistors, interconnected with three conductor layers, which may be printed along with LEDs on the substrate of FIG. 2 to form an LED driver.

FIG. 6 is a cross-section of a small portion of a printed layer of the transistors 30 of FIG. 3 connected in parallel using three planes of conductor layers. About 2-10 of the parallel-connected transistors 30 may be printed in each separate group 32, and an array of the groups 32 is printed over the substrate 16.

In FIG. 6, the substrate 16 has a conductor layer 70 (e.g., silver, aluminum, copper). In one example, the conductor layer 70 is printed as an array of circular spots on the substrate 16 (see FIG. 3). The spots are electrically isolated from one another to allow groups of the transistors 30 to be interconnected in any manner to form the driver circuit and any other control circuit, including logic circuits. Instead of circular spots, the conductor layer 70 may be printed in square spots or other shaped spots.

The transistors 30 are then printed on the conductor layer 70 such as by flexography or by screen printing with a suitable mesh to allow the transistors 30 to pass through and control the thickness of the layer. Because of the comparatively low concentration, the transistors 30 will be printed as a loose monolayer and be fairly uniformly distributed over the conductor layer 70. The printed locations of the transistors 30 align with the locations of the printed spots of the conductor layer 70.

The solvent is then evaporated by heat using, for example, an infrared oven. After curing, the transistors 30 remain attached to the underlying conductor layer 70 with a small amount of residual resin that was dissolved in the ink as a viscosity modifier. The adhesive properties of the resin and the decrease in volume of resin underneath the transistors 30 during curing press the bottom electrode 72 against the underlying conductor layer 70, making ohmic contact with it.

A dielectric layer 74 is then printed to cover the conductor layer 70 and further secure the transistors 30 in position. The dielectric layer 74 is designed to self-planarize during curing, by surface tension, so as to pull off of or de-wet the top electrode 76 and the intermediate electrode 78. Therefore, etching the dielectric layer 74 is not required. If the dielectric layer 74 covers the electrodes 76/78, then a blanket etch may be used to expose the electrodes 76/78.

An intermediate conductor layer 80, aligned with the spots of the conductive layer 70, is then printed over the dielectric layer 74 to electrically contact the intermediate electrode 78 and is cured in an oven appropriate for the type of conductor being used. The various conductor layers may be metal (or contain metal) or be any other type of printable conductor layer.

Another thin dielectric layer 82 is printed over the intermediate conductor layer 80 so as not to cover the top electrode 76.

A top conductor layer 84, aligned with the spots of the intermediate conductor layer 80, is then printed over the dielectric layer 82 to electrically contact the top electrode 76 and is cured in an oven appropriate for the type of conductor being used.

A thicker metal layer 86 may then be printed over the conductor layer 84 for improving electrical conductivity and/or heat conduction. Portions of the conductor layers 70/80/84 extend out from the edge of the spot to form three terminals for the group of transistors 30.

FIG. 6 illustrates that the rightmost transistor 30A is oriented in the opposite direction. However, the intermediate electrode 88 is left floating, so the transistor 30A does not operate and has no effect on the resulting circuit.

The printed transistors 30 are connected in parallel by the conductor layers. Suitable operating voltages and control voltages are applied to the conductor layers to operate the transistors. In the example of FIG. 6, the top electrode 76 is the control electrode for the transistors 30 (e.g., for gates or bases). The remaining two electrodes are the current carrying electrodes (e.g., source/drain, emitter/collector). Since the intermediate electrode 88 of the improperly oriented transistor 30A is floating, the transistor 30A remains off and an open circuit.

Figure 7:
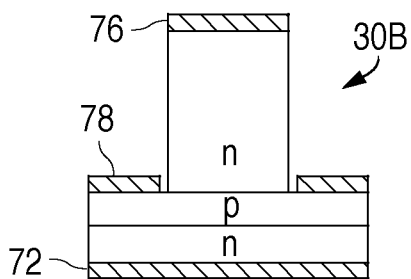
FIG. 7 is a cross-sectional view of a bipolar transistor that may be printed in FIG. 6.

FIG. 7 illustrates how the transistors 30 may be npn bipolar transistors 30B, where the intermediate electrode 78 is the base electrode. The intermediate electrode 78 may be connected to any of the other semiconductor layers in the transistor 30B using a via. A pnp bipolar transistor can be formed instead.

Figure 8:
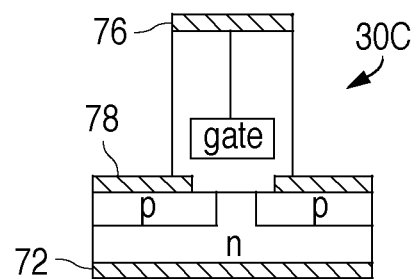
FIG. 8 is a cross-sectional view of a MOSFET that may be printed in FIG. 6.

FIG. 8 illustrates how the transistors 30 may be p-channel MOSFETs 30C, where the intermediate electrode 78 is the source electrode. The intermediate electrode 78 may be connected to any of the other layers in the transistor 30C using a via. An n-channel MOSFET can be formed instead.

If the transistors 30 are to be connected as diodes, only two of the conductor layers in FIG. 6 need to be used. Accordingly, the effective polarity of the diode may be selected by which two conductor layers are used to contact the diodes.

Any number of the transistors 30 may be connected in parallel in a group for handling a wide range of currents. In one embodiment, about 10 transistors 30 are located in each group 32. The groups 32 of the transistors 30 (and conductor layers) may be printed as a 2-dimensional array of groups 32 and connected to other components, including resistors, to form a suitable driver 20 (FIG. 2), or the entire driver circuit may be optimally printed on the substrate 16 to achieve the smallest size.

Figure 9:
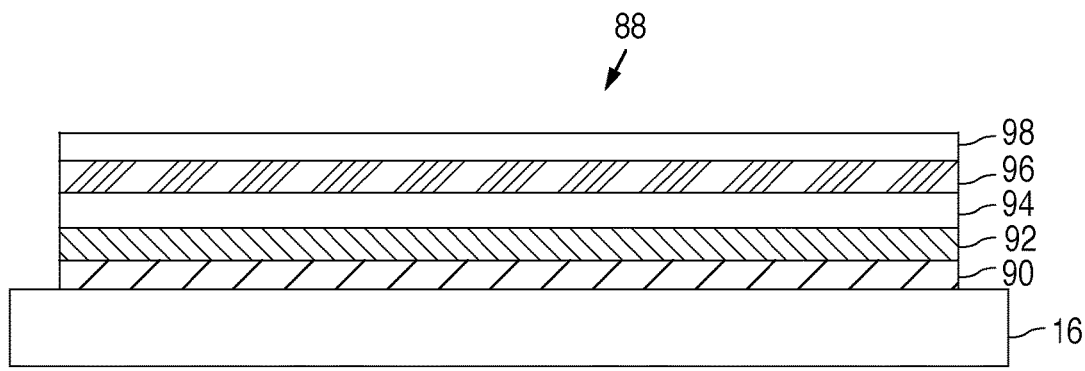
FIG. 9 is a cross-sectional view of a battery that may be printed on the substrate of FIG. 2 to power the LED driver.

FIG. 9 illustrates a printed battery 88 that may be printed on the substrate 16 of FIG. 2 to form the battery 18 of FIG. 2. The battery 18 of FIG. 2 may comprise a plurality of printed batteries connected in any configuration of serial and parallel by the traces 26 to obtain the desired voltage and current for driving the LEDs.

FIG. 9 is a cross-section of the battery 88 generally taken from US 2015/0024247 but formed on the same substrate 16 as the LEDs and driver circuitry. FIG. 9 illustrates the substrate 16, a first metal current collector layer 90 (a metal foil), a first active electrode layer 92, a separator layer 94, a second active electrode layer 96, and a second metal current collector layer 98 (a metal foil). The metal layers 90 and 98 are the anode and cathode conductors for the battery 88 that are contacted by the printed metal traces 26 in FIG. 2. Electrical contact to the second metal current collector 98 by a trace 26 may be made by forming the second metal current collector 98 so that an end resides on the surface of the substrate 16 (FIG. 2) planar with the first metal current collector 90. This configuration makes it easier for the traces 26 to electrically contact the current collectors 90/98.

The electrodes 92/96 comprise gel or paste electrolytes that can be decomposed to supply ions for generating a voltage and providing current, as described in US 2015/0024247. The cathode electrode additionally contains silver-oxide. The battery is referred to as a silver-oxide battery. The separator 94 is permeable to the ions produced and may be a polymer film, cellulose, or other suitable material. Such batteries generate between 1.1-1.8 volts, and the voltage drops as the battery become depleted. For example, the voltage may drop by half over a 24 hour period, depending on the current supplied by the battery, such as 100 uA. Many other well-known battery types can be printed, such as lithium-ion batteries and NiCad batteries. The batteries may be rechargeable or non-rechargeable. The thickness of a printed battery is typically less than 1 mm. Since an LED requires about 3-5 volts to emit a suitable brightness, multiple batteries 88 would be connected in series to form the battery 18 in FIG. 2.

The battery of FIG. 9 is a "single layer" type, where there is only a single interface between two active electrodes; however, the battery may have multiple battery layers stacked over each other and interconnected in parallel or series to increase current or voltage. Stacked battery layers make more efficient use of the substrate 16 surface area and may reduce resistive losses.

Figure 10:
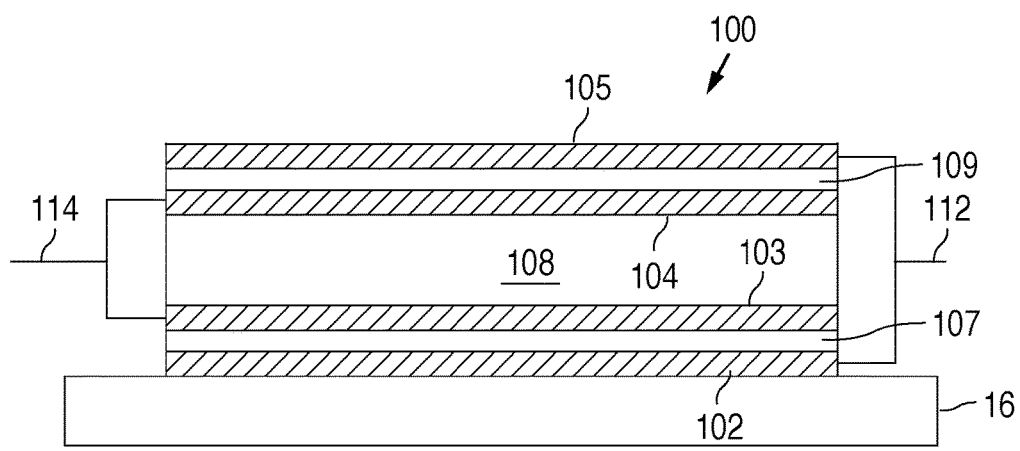
FIG. 10 is a cross-sectional view of a multi-layer capacitor that may be printed on the substrate of FIG. 2.

FIG. 10 illustrates a capacitor 100 that may be printed within the driver 20 of FIG. 2. Multiple metal layers 102-105 are separated by dielectric layers 107-109 to form a stacked capacitor for increased capacitance, where the layers 102, 107, and 103 form a first capacitor, and the layers 104, 109, and 105 form a second capacitor connected together in parallel by the conductors 112 and 114. Additional layers may be stacked and connected in parallel to increase the capacitance. Super capacitors can also be formed. Capacitors may be useful for creating a flashing driver circuit (or for other timing functions) or for smoothing a voltage.

Resistors can be printed by depositing resistive materials, such as carbon or thin metal layers, and selecting the resistance by the pattern of the resistive material or by the locations of electrical connections to the resistive pattern.

Inductors can be printed by forming flat coils of metal or other shapes. Multiple layers of coils can be printed to increase the inductance.

Figure 11:
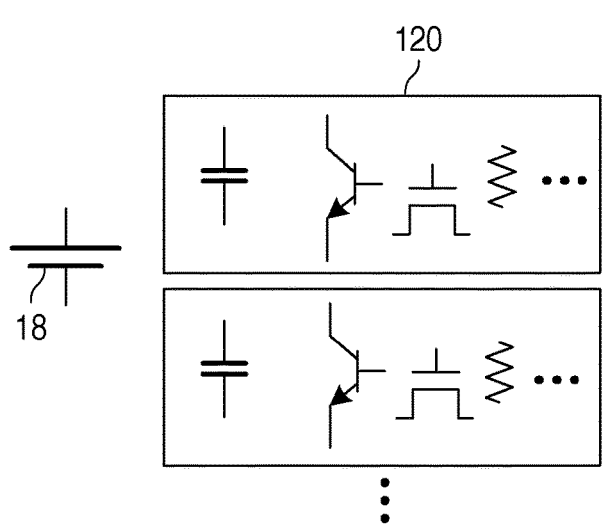
FIG. 11 is a schematic of various electrical components that may be printed on the substrate of FIG. 2, where any combination of the components may be interconnected by printed traces, such as shown in FIG. 12, to form an LED driver.

FIG. 11 illustrates that the various components described above may be printed over the substrate 16 to form a standardized array of printed components that may be interconnected by a metal trace pattern to customize the driver 20. A transistor symbol represents a group of microscopic transistors connected in parallel, as shown in FIG. 3. Since the LED driver is quite simple, the array of interconnectable components can be made small. Repeated blocks 120 of available components may be printed, or the printing may be customized for a specific driver circuit for the LEDs. By providing a generic driver that can be customized by the user, by programming the traces, the reliability of the printed circuit can be made very high.

Figure 12:
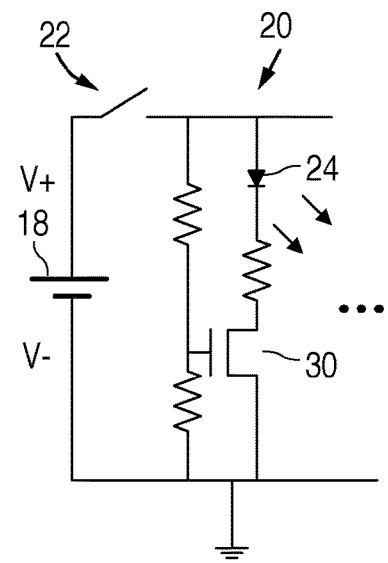
FIG. 12 is a schematic of a simple driver circuit for a single LED group, where each LED group may have an identical driver that is individually controllable.

FIG. 12 illustrates a simple driver 20 for only one of the LED areas 24 in FIG. 2 that can be formed by interconnecting the components of FIG. 11 and FIG. 3. The driver circuit of FIG. 12 may be repeated for each LED area 24. A photo-switch 22 (e.g., using a photo-diode) is shown connecting the battery 18 to the driver 20 for enabling the circuit. For example, when the photo-switch 22 senses light, the LEDs are energized by the driver 20. A photo-diode can be printed as a group of identical microscopic photo-diodes connected in parallel. The photo-diodes can be silicon based or GaN based. Other switches and control schemes can be used.

Figure 13:
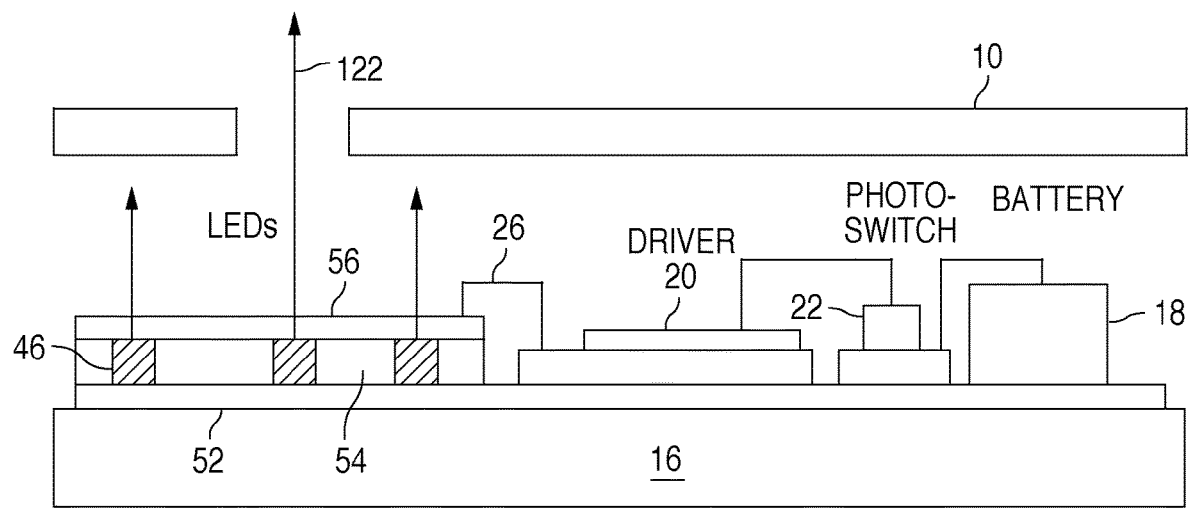
FIG. 13 is a simplified cross-sectional view of a battery, driver, photo-switch, and LEDs printed on the substrate of FIG. 2.

FIG. 13 illustrates various components printed on the substrate 16 as part of the structure of FIG. 2. A common bottom conductor layer 52, such as a negative voltage layer, is shown, but each component may have a separate conductor layer or be printed on the dielectric substrate 16. The various LEDs 46, conductor layers 52 and 56, and dielectric layer 54 are printed over the substrate 16 (see FIG. 4 for more detail). The printed driver 20 is connected to the LEDs via the metal traces 26 (see FIGS. 3, 6-8, 11, and 12 for more detail). A photo-switch 22 can be printed on the substrate 16 or may be a pre-formed device that is mounted on the substrate 16. The photo-switch 22 applies battery voltage to the driver 20 when there is sufficient light, such as when the substrate/LED/driver is an insert in a product package and the package is placed at the front of a shelf. The driver may flash the LEDs to draw a customer's attention to the displayed product package. The battery 18 is printed on the substrate 16 (see FIG. 9 for more detail). An overlay 10 allows light 122 to pass through and may be patterned for any image (see FIG. 1 for more details).

For practical printing using an ink containing pre-formed devices, all the printed semiconductor components (e.g., LEDs and transistors) should have a maximum diameter of 200 um.

In the event that certain components cannot be practically printed on the substrate 16, such as a voltage regulator, such pre-fabricated circuits (e.g., integrated circuits) may be positioned on metal pads formed on the substrate 16 and soldered to the pads or electrically connected in other ways to the circuitry on the substrate 16.

In one embodiment, a printed battery is not used, and the power supply for the driver is a pre-formed battery, such a group of AAA or coin batteries, that is inserted into a receptacle on the substrate 16.

Figure 14:
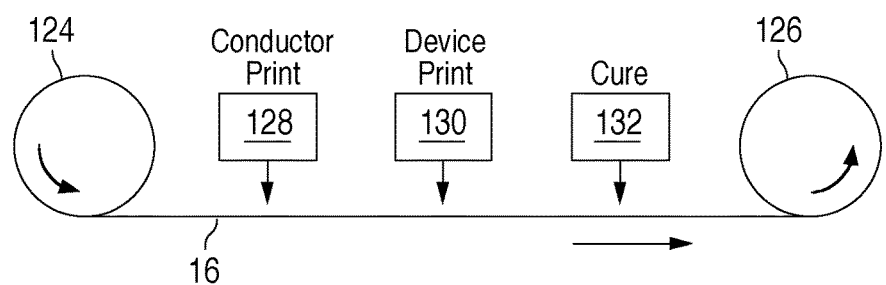
FIG. 14 illustrates how the circuitry of FIGS. 2 and 13 may be printed in a roll-to-roll process.

FIG. 14 schematically illustrates one possible assembly line for manufacturing the circuits by printing in a roll-to-roll process under atmospheric conditions. The roll 124 contains the substrate 16 material, and the roll 126 is a take-up roll. The various stations are labeled as conductor print 128, device print 130, and cure 132. In the example used to form the embodiment of FIGS. 2 and 13, the process sequentially prints the various layers and cures the layers.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:
1. A method for customizing a display comprising:
providing a substrate supporting light emitting diodes (LEDs) printed on the substrate for generating light, the LEDs being printed as a plurality of groups of LEDs, wherein multiple LEDs in each group are connected in parallel, wherein the LEDs are randomly distributed within each group on the substrate, and wherein the groups of LEDs are printed in a standardized pattern; providing a battery supported by the substrate; providing a driver circuit for the LEDs, the driver circuit being supported by the substrate, the substrate, the LEDs, the battery, and the driver circuit being formed as a standardized structure; and after forming the standardized structure, programming the driver circuit to energize the plurality of groups of LEDs to create a customized repeating illumination pattern, wherein the illumination pattern is solely designed for a desired visual effect and the LEDs are not interconnected to perform any desired logic or analog function, wherein the driver circuit is configured to dynamically control the LEDs to create an automatically changing visual display without external control signals being supplied, wherein different groups of the LEDs are illuminated at different times to create an animated effect based on the programming of the driver circuit;
wherein an actuator comprises a photo-switch supported by the substrate coupled between the battery and the driver circuit that couples battery power to the driver circuit when ambient light incident on the photo-switch exceeds a threshold, such that the LEDs are energized only when the ambient light incident on the photo-switch has exceeded the threshold.

2. The method of claim 1 wherein the driver circuit comprises an interconnection pattern, wherein programming the driver circuit comprises customizing the interconnection pattern on the substrate to conduct power from the battery to selected groups of LEDs.

3. The method of claim 2 wherein providing the driver circuit comprises forming a standardized interconnection pattern, and wherein programming the driver circuit comprises customizing connections between the interconnection pattern, the groups of LEDs, and the driver circuit.

4. The method of claim 3 wherein the driver circuit is programmed by customizing the interconnection pattern in a patch area on the substrate.

5. The method of claim 1 wherein the animated effect comprises a flashing of the LEDs.

6. The method of claim 1 further comprising affixing a graphics overlay over the LEDs to selectively block light emitted from the LEDs.

7. The method of claim 1 further comprising providing the substrate in a product package so that the illumination pattern is visible to a viewer of the product package.

8. The method of claim 1 wherein each group of LEDs is separately controllable by programming the driver circuit.

9. The method of claim 1 wherein the driver circuit comprises driving components for each group of LEDs.

10. The method of claim 9 wherein the driving components are programmable to customize the illumination pattern.

11. The method of claim 9 wherein the driving components are programmable by customizing an interconnection pattern between the driver circuit and the groups of LEDs.

12. The method of claim 1 further comprising providing the actuator on the substrate for energizing the groups of LEDs via the driver circuit at certain times to conserve power.

13. The method of claim 1 wherein the driver circuit comprises transistors.

14. The method of claim 1 wherein the standardized pattern of the groups of LEDs is a rectangular array of the groups.

15. The method of claim 1 wherein the standardized pattern of the groups of LEDs comprises a plurality of blocks of the groups of LEDs.

16. A customizable display structure, the structure comprising: a substrate; light emitting diodes (LEDs) printed on the substrate for generating light, the LEDs being printed as a plurality of groups of LEDs, wherein multiple LEDs in each group are connected in parallel, and wherein the LEDs are randomly distributed within each group on the substrate, wherein the groups of LEDs are printed in a standardized pattern; a battery supported by the substrate; and a driver circuit, comprising transistors, for the LEDs, the driver circuit being supported by the substrate, the driver circuit further comprising an interconnection pattern on the substrate that conducts power from the battery to selected ones of the groups of LEDs, wherein the driver circuit is programmable to energize the plurality of groups of LEDs to create a customized repeating illumination pattern, wherein the illumination pattern is solely designed for a desired visual effect and the LEDs are not interconnected to perform any desired logic or analog function, wherein the driver circuit is configured to dynamically control the LEDs to create an automatically changing visual display without external control signals being supplied, wherein different groups of the LEDs are illuminated at different times to create an animated effect based on programming of the driver circuit;

wherein an actuator comprises a photo-switch supported by the substrate coupled between the battery and the driver circuit that couples battery power to the driver circuit when ambient light incident on the photo-switch exceeds a threshold, such that the LEDs are energized only when the ambient light incident on the photo-switch has exceeded the threshold.

17. The structure of claim 16 wherein the driver circuit is programmed by customizing the interconnection pattern.

18. The structure of claim 16 wherein the display structure is initially formed as a standardized structure and, based on a desired visual display, the driver circuit is then programmed to be customized.

19. The structure of claim 16 further comprising a graphics overlay to selectively block light emitted from the LEDs.

* * * * *